United States Patent
Guerini (10) Patent No.: US 8,702,998 B1
(45) Date of Patent: Apr. 22, 2014

(54) METHOD TO MANUFACTURE A FLEXIBLE CABLE FOR A DISK DRIVE

(75) Inventor: Albert J. Guerini, Gilroy, CA (US)

(73) Assignee: Western Digital Technologies, Inc., Irvine, CA (US)

(*) Notice: Subject to any disclaimer, the term of this patent is extended or adjusted under 35 U.S.C. 154(b) by 104 days.

(21) Appl. No.: 13/416,992

(22) Filed: Mar. 9, 2012

(51) Int. Cl.
   *H01B 13/00* (2006.01)

(52) U.S. Cl.
   USPC ......... 216/13; 216/16; 360/264.2; 360/266.3; 360/245.9; 29/830; 29/832; 29/845; 29/846

(58) Field of Classification Search
   USPC ............ 216/13, 16; 360/264.2, 266.3, 245.9; 29/830, 832, 845, 846
   See application file for complete search history.

(56) References Cited

U.S. PATENT DOCUMENTS

| | | | | |
|---|---|---|---|---|
| 4,906,803 | A * | 3/1990 | Albrechta et al. | 174/254 |
| 5,721,007 | A | 2/1998 | Lynch et al. | |
| 6,214,525 | B1 | 4/2001 | Boyko et al. | |
| 6,320,835 | B1 * | 11/2001 | Kamei | 720/653 |
| 6,483,669 | B1 * | 11/2002 | Krinke | 360/244.1 |
| 7,382,582 | B1 | 6/2008 | Cuevas | |
| 7,829,793 | B2 | 11/2010 | Schreiber et al. | |
| 7,937,832 | B2 | 5/2011 | Oda et al. | |
| 2007/0149001 | A1 | 6/2007 | Uka | |

* cited by examiner

*Primary Examiner* — Nadine Norton
*Assistant Examiner* — Maki Angadi (57) ABSTRACT

A novel method to manufacture a flexible cable for a disk drive is disclosed. The method includes providing a flexible laminar sheet. The flexible laminar sheet has a dielectric substrate layer and an electrically conductive layer contacting a first side of the dielectric substrate layer. A portion of the electrically conductive layer is etched away to define a first plurality of electrically conductive traces and to expose an etched surface of the first side of the dielectric substrate layer. A second plurality of electrically conductive traces is deposited on the etched surface of the first side of the dielectric substrate layer.

15 Claims, 7 Drawing Sheets

METHOD TO MANUFACTURE A FLEXIBLE CABLE FOR A DISK DRIVE

BACKGROUND

Information storage devices are used to retrieve and/or store data in computers and other consumer electronics devices. A magnetic hard disk drive is an example of an information storage device that includes one or more heads that can both read and write, but other information storage devices also include heads—sometimes including heads that cannot write.

In a modern magnetic hard disk drive device, each head is a sub-component of a head gimbal assembly (HGA) that typically includes a suspension assembly with a flexure to carry the electrical signals to and from the head. The HGA, in turn, is a sub-component of a head stack assembly (HSA) that typically includes a plurality of HGAs, an actuator, and a laminar flexible cable. The plurality of HGAs are attached to various arms of the actuator, and each of the flexures of the HGAs has a flexure tail that is electrically connected to a distal region of the HSA's laminar flexible cable.

Flexible cables in modern disk drives typically include conductive traces on a dielectric and flexible structural layer. The distal region of the laminar flexible cable is attached to, and moves with, the actuator, while a proximal region of the laminar flexible cable is fixed to the disk drive base by a connector bracket. The flexible cable may be reinforced by a stiffener (e.g. aluminum stiffener) in the distal region where the flexible cable is attached to the actuator body, to provide more structural rigidity to the flexible cable in the distal region. An integrated circuit (IC) chip (e.g. preamplifier chip) is typically also mounted on the flexible cable in the distal region.

The maximum width of flexible cables in modern disk drives is typically limited, for example by the height of the disk drive into which the flexible cable will be assembled. However, the size of modern disk drives has trended smaller, and there is no indication that such trend will reverse. Moreover, the number of required conductive traces on the flexible cable is generally increasing, since the number of conductive paths to each HGA has increased to enable additional structures in and functions of the modern HGA. For example, modern HGAs typically include both a read and write transducer, and may also include a microactuator, a heater, a touch-down detector, and/or a laser device to locally heat an adjacent disk medium. Hence, there is a need in the information storage device art for improved designs and methods to manufacture disk drive flexible cables that can accommodate a greater number of electrical traces with connections to a mounted IC chip (especially in the distal region of the flexible cable).

DETAILED DESCRIPTION OF EXAMPLE EMBODIMENTS

Figure 1:
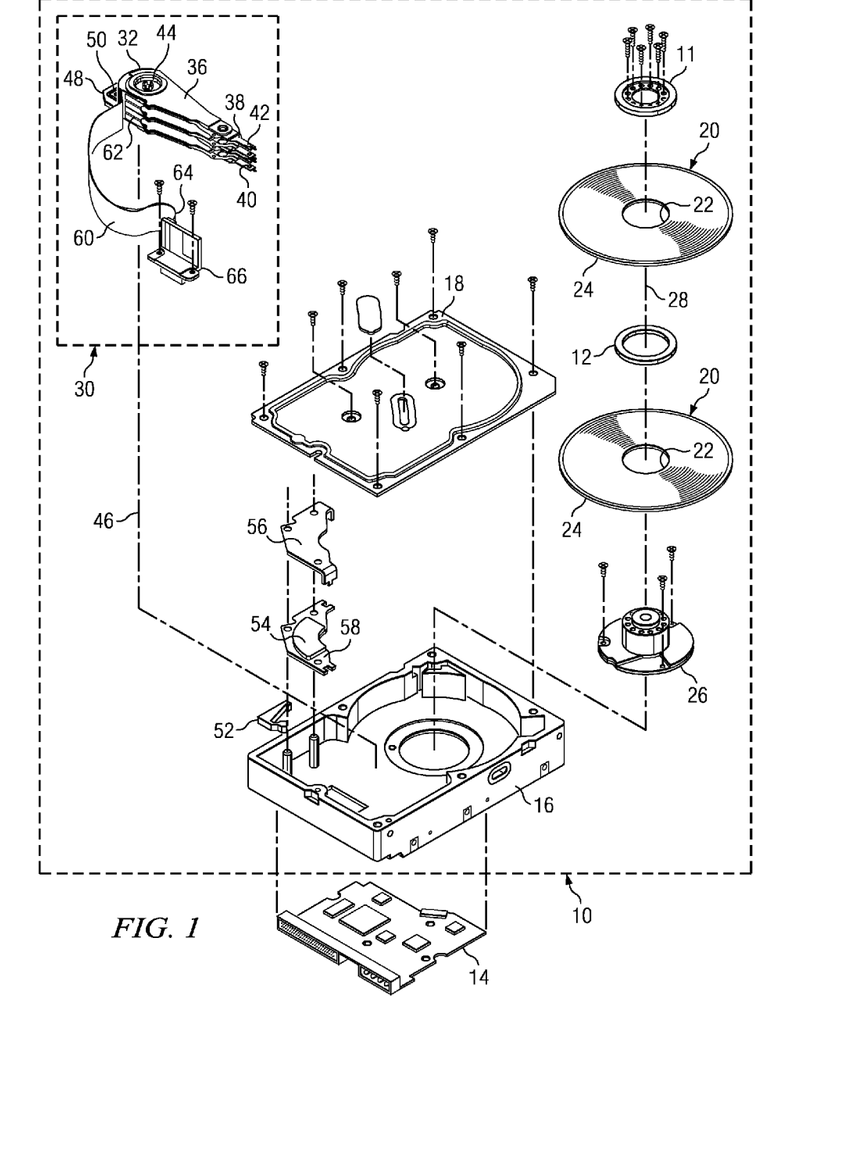
FIG. 1 is an exploded view of a disk drive capable of including a flexible cable manufactured according to an embodiment of the present invention.

FIG. 1 is an exploded perspective view of a disk drive according to an example embodiment of the present invention. The disk drive includes a head disk assembly (HDA) 10 and a printed circuit board assembly (PCBA) 14. The HDA 10 includes a base 16 and cover 18 that together house at least one annular magnetic disk 20. Each disk 20 contains a plurality of magnetic tracks for storing data. The tracks are disposed upon opposing first and second disk surfaces of the disk 20 that extend between an inner disk edge 22 (corresponding to the inner diameter) and an outer disk edge 24 (corresponding to the outer diameter) of the disk 20. The head disk assembly 10 further includes a spindle motor 26 for rotating the disk 20 about a disk axis of rotation 28. The spindle motor 26 includes a spindle motor hub that is rotatably attached to the base 16 of the HDA 10. Disks 20 may be stacked and separated with one or more annular disk spacers 12 that are disposed about the hub, all held fixed to the hub by disk clamp 11.

The HDA 10 further includes a head stack assembly (HSA) 30 rotatably attached to the base 16 of HDA 10. The HSA 30 includes an actuator comprising an actuator body 32 and one or more actuator arms 36 extending from the actuator body 32. The actuator body 32 includes a bore 44 and a pivot bearing cartridge engaged within the bore for facilitating the HSA 30 to rotate relative to HDA 10 about actuator pivot axis 46. One or two head gimbal assemblies (HGA) 38 are attached to a distal end of each actuator arm 36. Each HGA 38 includes a head (e.g. head 40) for reading and writing data from and to the disk 20, and a load beam 42 to compliantly preload the head against the disk 20. The HSA 30 further includes a coil support 48 that extends from one side of the HSA 30 that is opposite head 40. The coil support 48 is configured to support a coil 50 through which a controlled electrical current is passed. The coil 50 interacts with one or more magnets 54 that are attached to base 16 via a yoke structure 56, 58 to form a voice coil motor for controllably rotating the HSA 30. HDA 10 includes a latch 52 rotatably mounted on base 16 to prevent undesired rotations of HSA 30.

The PCBA 14 includes a servo control system for generating servo control signals to control the current through the coil 50 and thereby position the HSA 30 relative to tracks disposed upon surfaces of disk 20. The HSA 30 is electrically connected to PCBA 14 via a flexible cable 60. A distal region 62 of the flexible cable 60 is attached to, and moves with, the actuator body 32, while a proximal region 64 of the laminar flexible cable is fixed to the disk drive base 16 by a connector bracket 66. The flex cable 60 supplies current to the coil 50 and carries signals between the HSA 30 and the PCBA 14.

In the magnetic hard disk drive of FIG. 1, the head 40 includes a body called a "slider" that carries a magnetic transducer on its trailing end (not visible given the scale of FIG. 1). The magnetic transducer may include an inductive write element and a magnetoresistive read element. During operation the transducer is separated from the magnetic disk by a very thin hydrodynamic air bearing. As the motor 26 rotates the magnetic disk 20, the hydrodynamic air bearing is formed between an air bearing surface of the slider of head 40, and a surface of the magnetic disk 20. The thickness of the air bearing at the location of the transducer is commonly referred to as "flying height."

Figure 2:
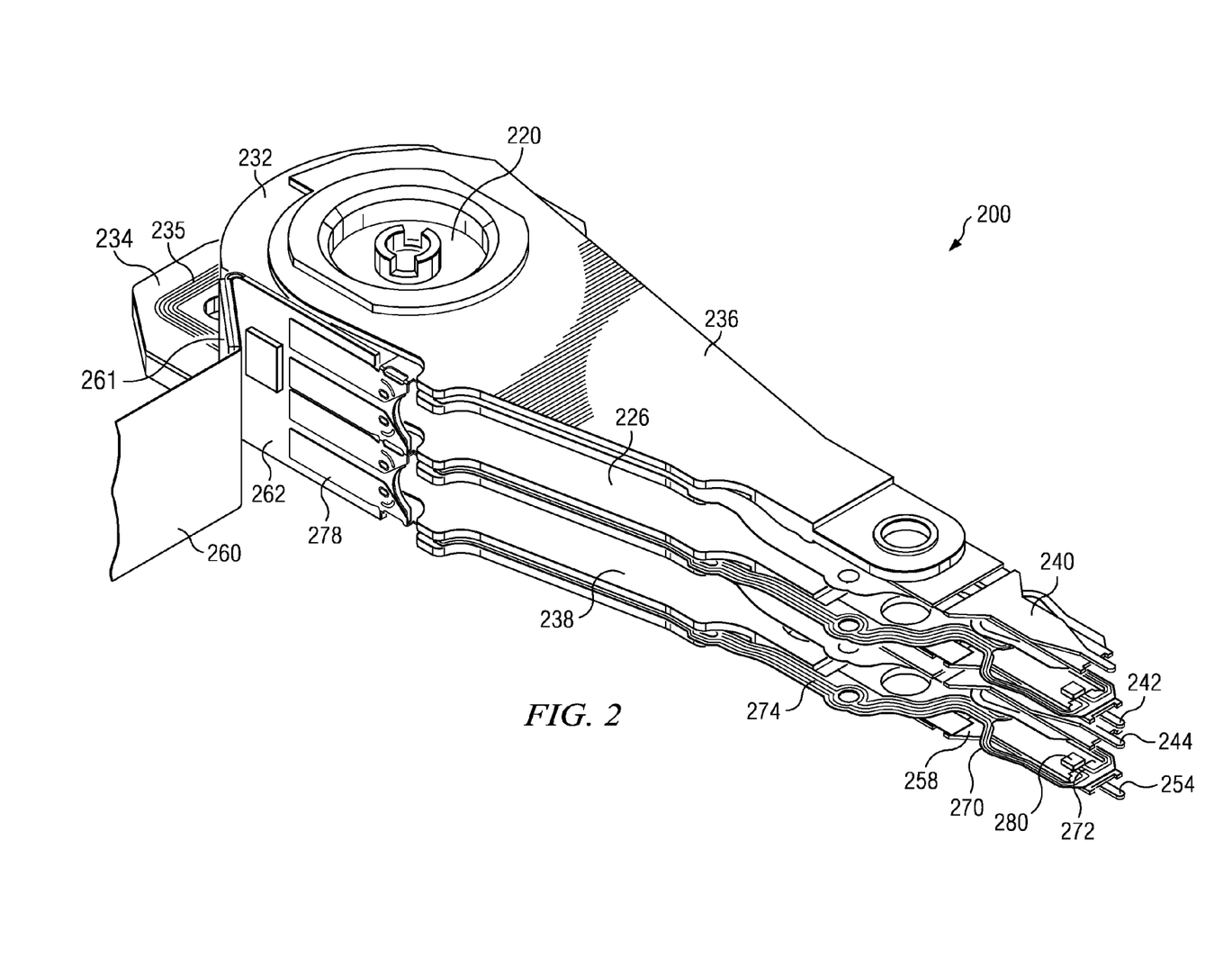
FIG. 2 depicts a head stack assembly capable of including a flexible cable manufactured according to an embodiment of the present invention.

FIG. 2 is a perspective view of a head stack assembly (HSA) 200 according to an example embodiment of the present invention. The HSA 200 includes an actuator body 232 and a plurality of actuator arms 226, 236, 238 extending from the actuator body 232. The actuator body 232 may comprise aluminum, for example. The actuator body 232 may include a pivot bearing cartridge 220 disposed in the actuator bore, and a coil support 234 that supports a coil 235 and extends from the actuator body 232 in a direction that is generally opposite the actuator arms 226, 236, 238.

In the embodiment of FIG. 2, the HSA 200 also includes a plurality of head gimbal assemblies (HGA) 240, 242, 244, 254, attached to the actuator arms 226, 236, 238. For example, such attachment may be made by swaging. Note that the inner actuator arm 226 includes two HGAs, while each of the outer actuator arms 236, 238, includes only one HGA. This is because in a fully populated disk drive the inner arms are positioned between disk surfaces while the outer actuator arms are positioned over (or under) a single disk surface. In a depopulated disk drive, however, any of the actuator arms may have one or zero HGAs, possibly replaced by a dummy mass.

Each HGA includes a head for reading and/or writing to an adjacent disk surface (e.g. HGA 254 includes head 280). The head 280 is attached to a tongue portion 272 of a laminated flexure 270. The laminated flexure 270 is part of the HGA 254, and is attached to a load beam 258 of the HGA 254. The laminated flexure 270 may include a flexure structural layer (e.g. stainless steel), a flexure dielectric layer (e.g. polymide), and a flexure conductive layer into which traces are patterned (e.g. copper).

In the embodiment of FIG. 2, the HSA 200 also includes a flexible cable 260 having a distal region 262 adjacent the actuator body 232. The flexible cable 260 may comprise a laminate that includes a dielectric substrate layer and a conductive layer. The laminar flexible cable 260 may also include a metallic stiffener 261 (e.g. aluminum), which forms an additional metal layer in contact with the dielectric substrate layer. The laminated flexure 270 includes a flexure tail 274 that includes a terminal region 278 that is electrically connected to bond pads of the flexible cable 260.

Methods of electrical connection of the flexure tails to the flexible cable 260 include ultrasonic bonding of gold coatings thereon, solder reflow, solder ball jet (SBJ), and anisotropic conductive film (ACF) bonding, and are preferably but not necessarily automated. To electrically connect and securely attach the flexure tails to the flexible cable 260, the flexure tails are first aligned with electrical terminals of the distal region 262 of the flexible cable 260, and then pressed against the distal region 262 of the flexible cable 260 (at least temporarily) while electrical connection is established and secure attachment is completed.

Figure 3:
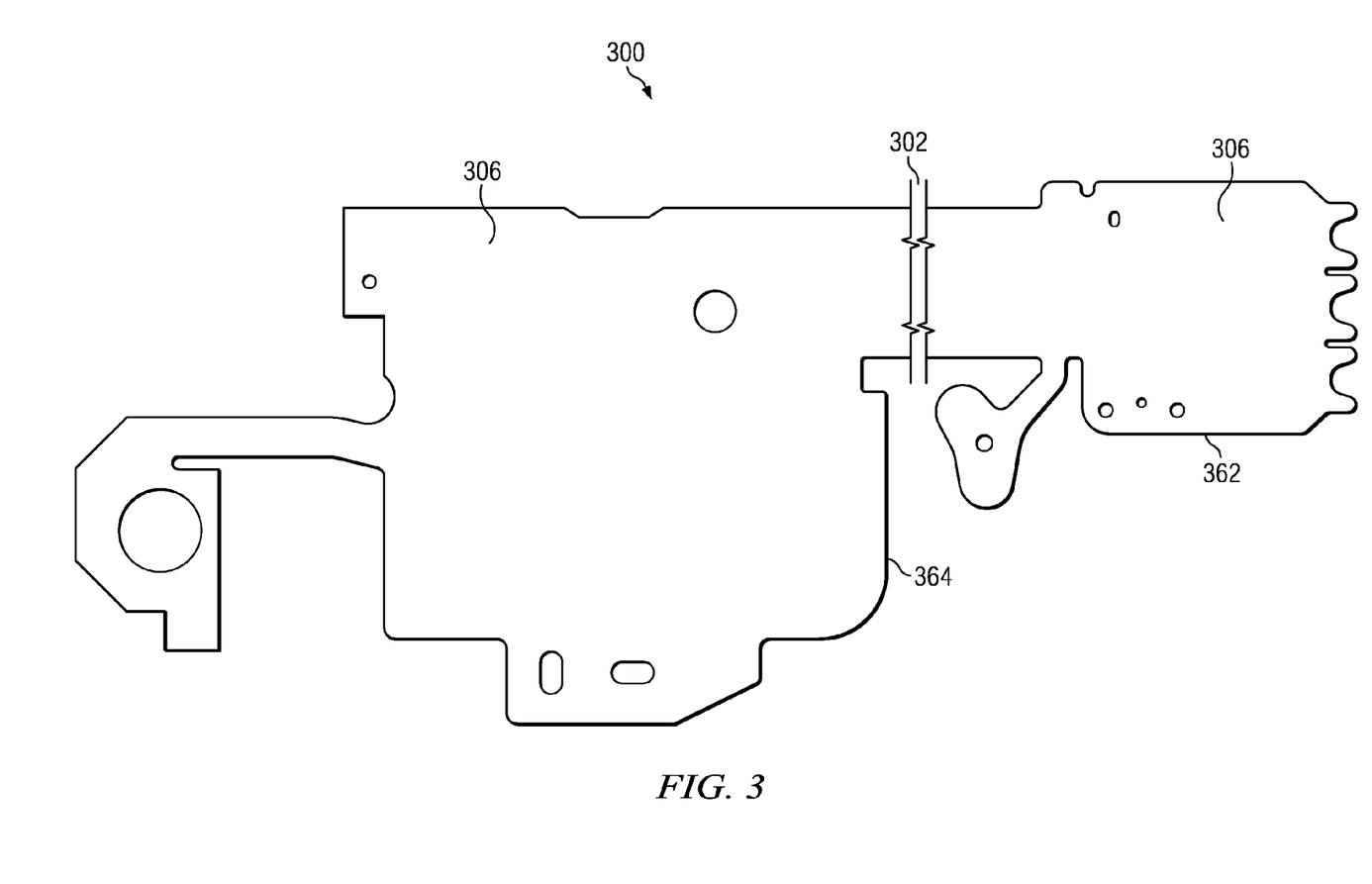
FIG. 3 depicts a flexible laminar sheet prior to a subtractive process according to an embodiment of the present invention.

FIG. 3 depicts a flexible laminar sheet 300 at a stage of manufacture that is prior to a subtractive process that will define some, but not all, of the electrical traces of a flexible cable. A middle portion 302 of the flexible laminar sheet 300 has been cut away in the view of FIG. 3, to facilitate magnification of a distal region 362 of the flexible laminar sheet 300, and magnification of a proximal region 364 of the flexible laminar sheet 300. The flexible laminar sheet 300 includes a flexible dielectric substrate layer (e.g. a polymeric material) that is completely covered by an electrically conductive layer 306 (e.g. copper).

The conductive layer 306 is in contact with the side of the dielectric substrate layer that would face the viewer in FIG. 3, but since the dielectric substrate layer is underneath the electrically conductive layer 306, only the electrically conductive layer 306 is visible in the view of FIG. 3. In certain embodiments, the electrically conductive layer 306 may preferably comprise copper having a thickness in the range 10 microns to 20 microns.

Figure 4A:
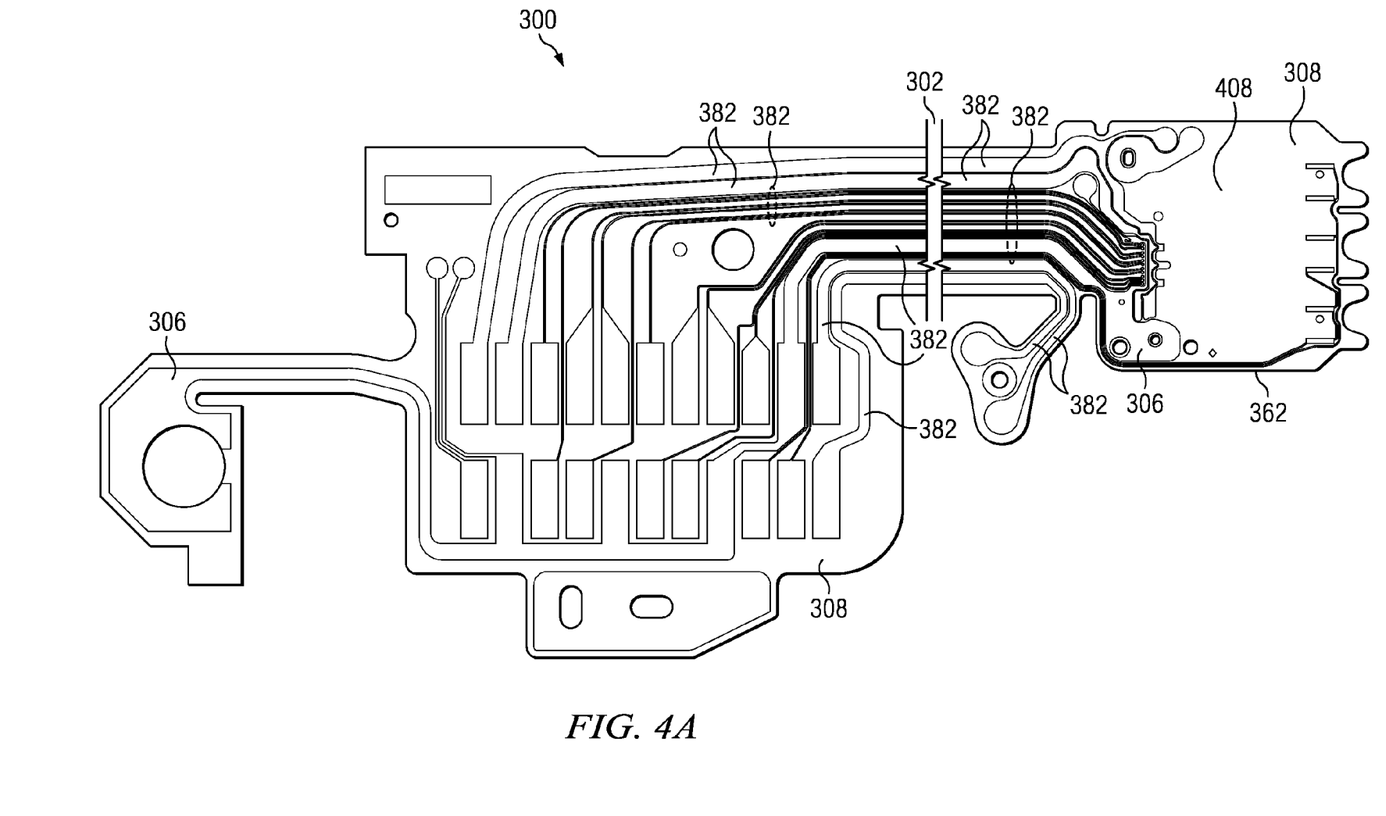
FIG. 4A depicts a flexible laminar sheet after a subtractive process according to an embodiment of the present invention.
Figure 4B:
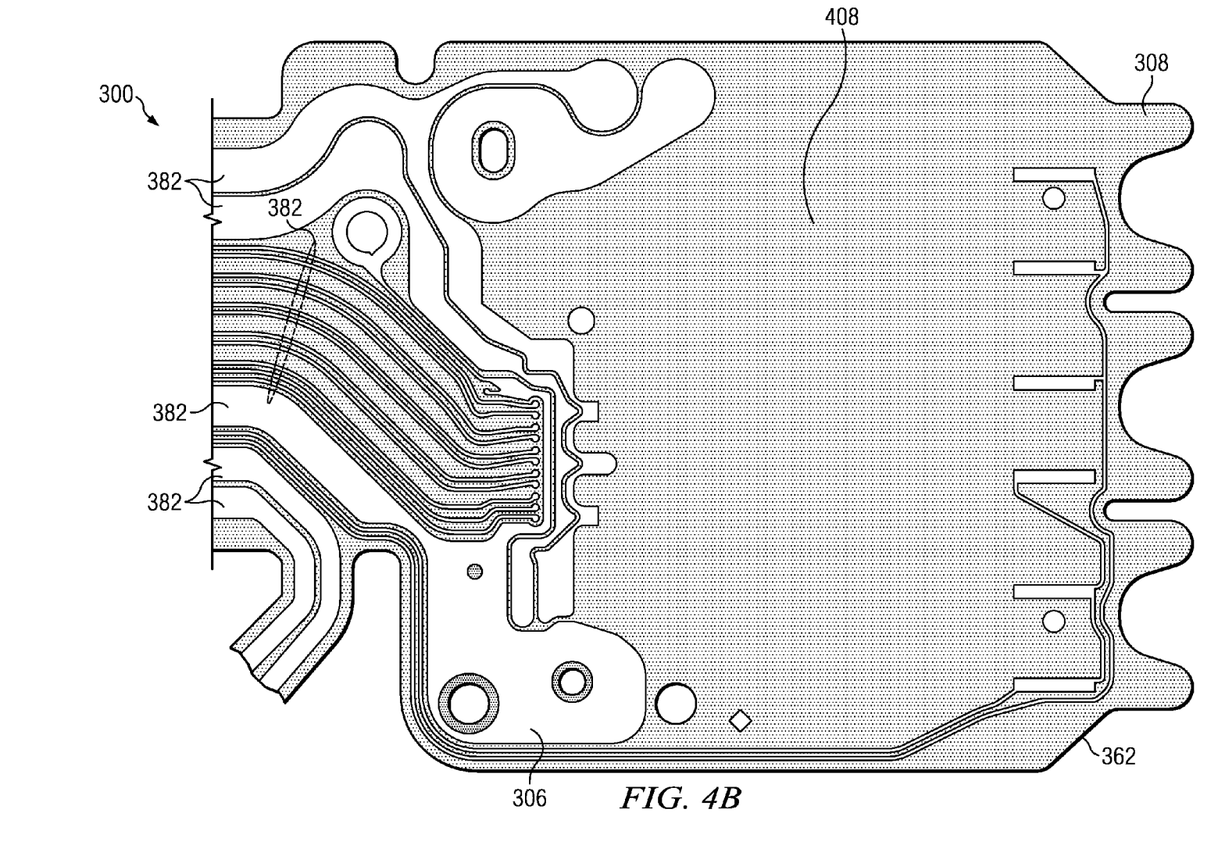
FIG. 4B is a magnified view of a distal region of the flexible laminar sheet of FIG. 4A.

FIG. 4A depicts the flexible laminar sheet 300, except after a subtractive process according to an embodiment of the present invention. FIG. 4B is a magnified view of a distal region of the flexible laminar sheet 300 of FIG. 4A. At this stage, a portion of the electrically conductive layer 306 has been etched away to define a first plurality of electrically conductive traces 382 and to expose an etched surface 408 of the first side of the flexible dielectric substrate layer 308. Note that in the prior art, traces would be subtractively defined within the etched surface 408, rather than reserving this region for the later additive addition of traces, as in certain embodiments of the present invention. Note also that to avoid redundancy herein, like numerical labels, if not otherwise described with reference to FIGS. 4A and 4B, have the same meaning as described with reference to FIG. 3.

In the embodiment of FIGS. 4A and 4B, the first plurality of electrically conductive traces 382 optionally may be defined by a wet or dry etching. As an example of a suitable wet etching technique, a photoresist layer may be deposited on the electrically conductive layer 306 of FIG. 3, and then patterned by exposure to light through a mask. Then, the flexible laminar sheet 300 may be immersed in an acid bath to etch away exposed portions of the electrically conductive layer 306—thereby defining the first plurality of electrically conductive traces 382. Subsequently, the remaining portions (after patterning) of the photo resist layer may be fully or partially removed.

Figure 5A:
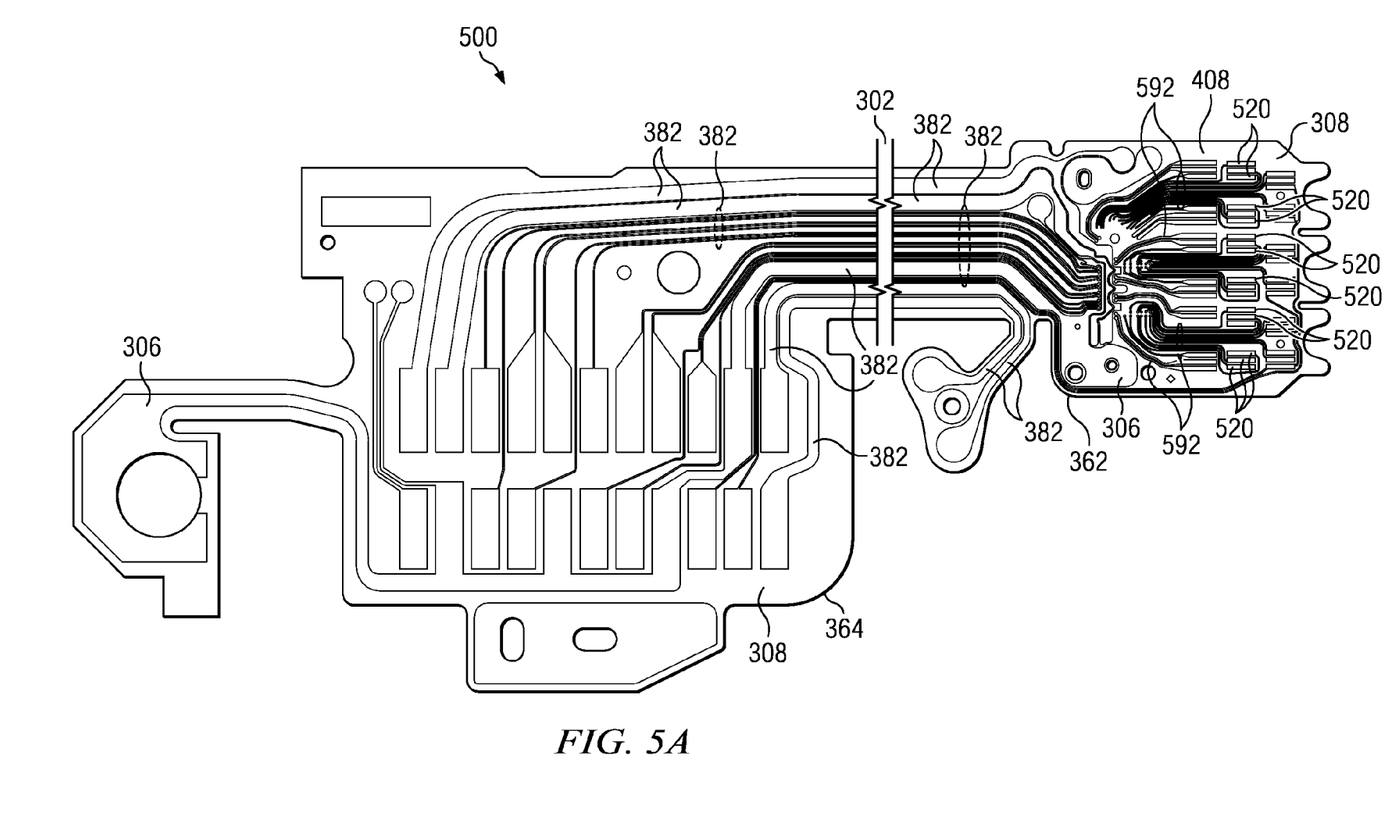
FIG. 5A depicts a flexible cable after subtractive and additive processes according to an embodiment of the present invention.
Figure 5B:
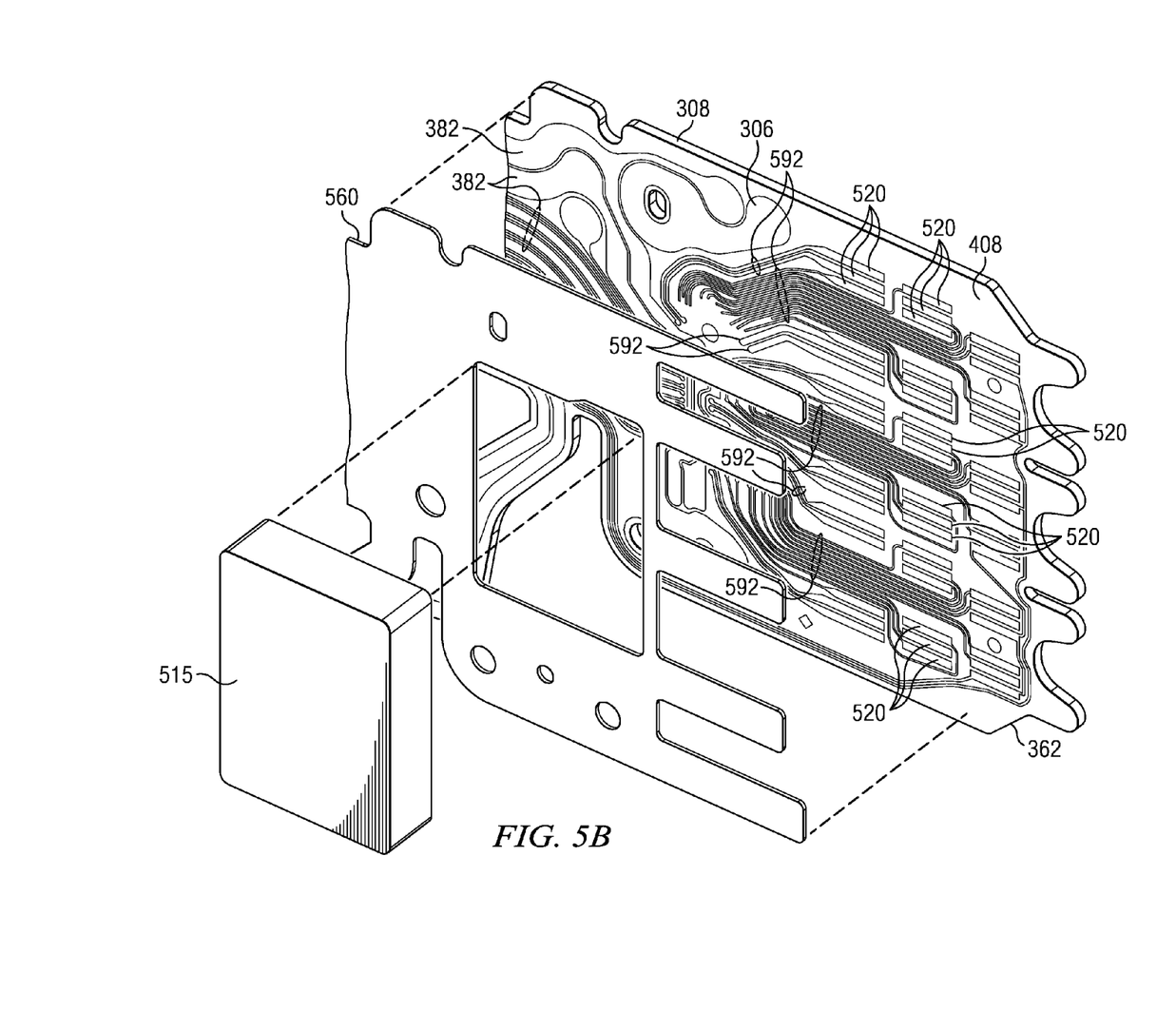
FIG. 5B is a perspective view of a distal region of the flexible cable of FIG. 5A, further with an insulative cover layer and an integrated circuit (IC) chip (shown exploded away so that underlying electrically conductive traces may still be viewed).

FIG. 5A depicts a flexible cable 500 after subtractive and additive processes have been performed (e.g. on the flexible laminated sheet 300), according to an embodiment of the present invention. FIG. 5B is a perspective view of a distal region 362 of the flexible cable 500 of FIG. 5A, further with an insulative cover layer 560 and an integrated circuit (IC) chip 515 (shown exploded away so that underlying electrically conductive traces may still be viewed).

In the embodiment of FIGS. 5A and 5B, a second plurality of electrically conductive traces 592 has been deposited on the etched surface 408 of the first side of the flexible dielectric substrate layer 308. For example, in certain embodiments the second plurality of electrically conductive traces 592 may be deposited on the etched surface 408 of the first side of the dielectric substrate layer 308 by sputtering and patterning an electrically conductive seed layer on the etched surface 408 of the first side of the dielectric substrate layer 308, and then electroplating an electrically conductive metal (e.g. copper) on the electrically conductive seed layer.

In the embodiment of FIGS. 5A and 5B, some of the first plurality of electrically conductive traces 382 may be wider than others of the first plurality of electrically conductive traces 382, for example to match a lower desired electrical impedance. Likewise, some of the second plurality of electrically conductive traces 592 may be wider than others of the second plurality of electrically conductive traces 592. For example, in certain embodiments, those electrically conductive traces 592 that connect through to an inductive write element of a read/write head, may be wider than those that connect through to a magnetoresistive read element (e.g. a tunneling magnetoresistive read element) of the read/write head.

Note that while the first plurality of electrically conductive traces 382 were defined by a subtractive process, the second plurality of electrically conductive traces were deposited by an additive process. Still, both the first plurality of electrically conductive traces 382, and the second plurality of electrically conductive traces 592, are disposed on (and contact) the same first side of the dielectric substrate layer 308, with the second plurality of electrically conductive traces 592 being disposed on an etched surface 408 of the first side of the flexible dielectric substrate layer 308 (where the electrically conductive layer 306 had been previously removed).

In this way, the use of an additive process to create the second plurality of electrically conductive traces 592 may, in certain embodiments, advantageously decrease the minimum spacing between electrical traces, and/or decrease the minimum width of electrical traces, and so result in the ability to include a greater number of traces with connections to the mounted IC chip 515 in the distal region 362 of the flexible cable 500. For example, in certain embodiments, each of the first plurality of electrically conductive traces 382 may be separated from another of the first plurality of electrically conductive traces 382 by no less than 35 microns, while at least one of the second plurality of electrically conductive traces 592 is spaced from another of the second plurality of electrically conductive traces 592 by a minimum spacing that is less than 30 microns.

In the embodiment of FIG. 5B, the optional insulative cover layer 560 is shown exploded away from the flexible cable 500 so that the underlying first and second plurality of electrically conductive traces 382, 592 can be more clearly depicted. However, during fabrication of certain embodiments of the flexible cable 500, the insulative cover layer 560 may be laminated (for example by heating the insulative cover layer 560) on to the flexible cable 500, so that the insulative cover layer 560 is fixed in contact with the first and second pluralities of electrically conductive traces 382, 592. Note that the optional insulative cover layer 560 is not the same thing as the flexible dielectric substrate layer 308, since the flexible dielectric substrate layer 308 underlies the conductive traces 382, 592 at the time they are defined or deposited, while the insulative cover layer 560 is added (or optionally not added) over the conductive traces 382, 592 after they are defined or deposited.

During head stack assembly, a plurality of electrically conductive bond pads 520 of the flexible cable 500 is intended to be aligned with and connected to flexure bond pads of the terminal regions of HGA flexure tails (e.g. flexure tail terminal region 278 shown in FIG. 2). In certain embodiments, the flexible cable bond pads 520 comprise copper with a gold coating. In the embodiment of FIG. 5B, the insulative cover layer 560 is preferably patterned, for example with windows or cut-outs to allow electrical connections to be made with the IC chip 515 (e.g. a preamplifier chip) and/or to allow electrical connections to be made with flexible cable bond pads 520. For example, the IC chip 515 may be bonded and electrically connected to the first plurality of electrically conductive traces 382 and/or to the second plurality of electrically conductive traces 592, for example via conductive bumps (e.g. gold balls, tin solder bumps, or the like). As shown in FIG. 5A, the first plurality of electrically conductive traces 382 may extend substantially further from the IC chip 515 than does the second plurality of electrically conductive traces 592.

In the foregoing specification, the invention is described with reference to specific exemplary embodiments, but those skilled in the art will recognize that the invention is not limited to those. It is contemplated that various features and aspects of the invention may be used individually or jointly and possibly in a different environment or application. The specification and drawings are, accordingly, to be regarded as illustrative and exemplary rather than restrictive. For example, the word "preferably," and the phrase "preferably but not necessarily," are used synonymously herein to consistently include the meaning of "not necessarily" or optionally. "Comprising," "including," and "having," are intended to be open-ended terms.

What is claimed is:

1. A method to manufacture a flexible cable for a disk drive, the method comprising:
   providing a flexible laminar sheet having a dielectric substrate layer and an electrically conductive layer contacting a first side of the dielectric substrate layer;
   etching away a portion of the electrically conductive layer to define a first plurality of electrically conductive traces and to expose an etched surface of the first side of the dielectric substrate layer; and
   depositing a second plurality of electrically conductive traces on the etched surface of the first side of the dielectric substrate layer.

2. The method of claim 1 wherein the electrically conductive layer comprises copper having a thickness in the range 10 microns to 20 microns.

3. The method of claim 1 wherein etching away the portion of the electrically conductive layer comprises depositing and patterning a photoresist layer on the electrically conductive layer, and then immersing the flexible laminar sheet in an acid bath.

4. The method of claim 3 further comprising removing the photoresist layer.

5. The method of claim 1 wherein depositing the second plurality of electrically conductive traces on the etched surface of the first side of the dielectric substrate layer comprises sputtering and patterning an electrically conductive seed layer on the etched surface of the first side of the dielectric substrate layer, and then electroplating an electrically conductive metal on the electrically conductive seed layer.

6. The method of claim 5 wherein the electrically conductive metal comprises copper.

7. The method of claim 1 further comprising laminating a patterned insulative cover layer in contact with the first and second pluralities of electrically conductive traces.

8. The method of claim 7 wherein laminating the patterned insulative cover layer in contact with the first and second pluralities of electrically conductive traces comprises heating the patterned insulative cover layer.

9. The method of claim 1 further comprising bonding an integrated circuit (IC) chip to the first plurality of electrically conductive traces.

10. The method of claim 9 wherein the IC chip is further bonded to the second plurality of electrically conductive traces.

11. The method of claim 9 wherein the IC chip is a preamplifier chip.

12. The method of claim 1 wherein the first plurality of electrically conductive traces extends away from the IC chip further than does the second plurality of electrically conductive traces.

13. The method of claim 1 wherein each of the first plurality of electrically conductive traces is separated from another of the first plurality of electrically conductive traces by no less than 35 microns, and at least one of the second plurality of electrically conductive traces is spaced from another of the second plurality of electrically conductive traces by a minimum spacing that is less than 30 microns.

14. The method of claim 1 wherein the flexible laminar sheet comprises at least one additional layer in addition to the dielectric substrate layer and the electrically conductive layer.

15. The method of claim 14 wherein the at least one additional layer includes a metal layer contacting a second side of the dielectric substrate layer.

\* \* \* \* \*